United States Patent
Maeda et al.

(10) Patent No.: US 7,839,230 B2
(45) Date of Patent: Nov. 23, 2010

(54) PLL OSCILLATION CIRCUIT, POLAR TRANSMITTING CIRCUIT, AND COMMUNICATION DEVICE

(75) Inventors: Masakatsu Maeda, Osaka (JP); Takayuki Tsukizawa, Osaka (JP); Hiroyuki Yoshikawa, Tokyo (JP); Shunsuke Hirano, Kanagawa (JP)

(73) Assignee: Panasonic Corporation, Osaka (JP)

( * ) Notice: Subject to any disclaimer, the term of this patent is extended or adjusted under 35 U.S.C. 154(b) by 64 days.

(21) Appl. No.: 12/469,252

(22) Filed: May 20, 2009

(65) Prior Publication Data

US 2009/0289723 A1 Nov. 26, 2009

(30) Foreign Application Priority Data

May 22, 2008 (JP) ............................. 2008-134358

(51) Int. Cl.
*H03L 5/00* (2006.01)
(52) U.S. Cl. .................. 331/182; 331/17; 331/109; 331/175; 332/127; 332/128; 332/145; 332/151
(58) Field of Classification Search .................. 331/13, 331/16, 17, 109, 175, 182, 183; 322/127, 322/128, 145, 151
See application file for complete search history.

(56) References Cited

U.S. PATENT DOCUMENTS

| | | | | |
|---|---|---|---|---|
| 6,137,375 A | * | 10/2000 | Li | 331/175 |
| 6,268,780 B1 | * | 7/2001 | Olgaard et al. | 332/117 |
| 6,680,655 B2 | * | 1/2004 | Rogers | 331/109 |
| 7,012,470 B2 | * | 3/2006 | Suzuki et al. | 331/16 |
| 7,332,979 B2 | * | 2/2008 | Connell et al. | 331/183 |
| 7,675,379 B1 | * | 3/2010 | Groe | 332/144 |
| 2002/0168038 A1 | * | 11/2002 | Damgaard et al. | 375/344 |
| 2006/0290437 A1 | * | 12/2006 | Kimura | 332/127 |

FOREIGN PATENT DOCUMENTS

| | | |
|---|---|---|
| JP | 06-104640 | 4/1994 |
| JP | 2004-080624 | 3/2004 |
| JP | 2004-527982 | 9/2004 |
| WO | 02/097965 | 12/2002 |

* cited by examiner

*Primary Examiner*—Joseph Chang
*Assistant Examiner*—Jeffrey Shin
(74) *Attorney, Agent, or Firm*—Wenderoth, Lind & Ponack, L.L.P.

(57) ABSTRACT

Provided is a PLL oscillation circuit that can reduce the variability of modulation sensitivity of a VCO 101 and obtain a desired output amplitude quickly with high precision. An amplitude detector 103 detects an output amplitude of the VCO 101. An amplitude controller 105 controls a current value of a variable current source 109 so as to have an output amplitude of the VCO 101 detected by the amplitude detector 103 to be a desired amplitude. A LPF 108 is connected between the amplitude controller 105 and the variable current source 109. A switch 107 connects or disconnects the LPF 108 between the amplitude controller 105 and the variable current source 109. The amplitude controller 105 is connected to the variable current source 109 through either the LPF 108 or the switching switch 107.

12 Claims, 13 Drawing Sheets

F I G. 1
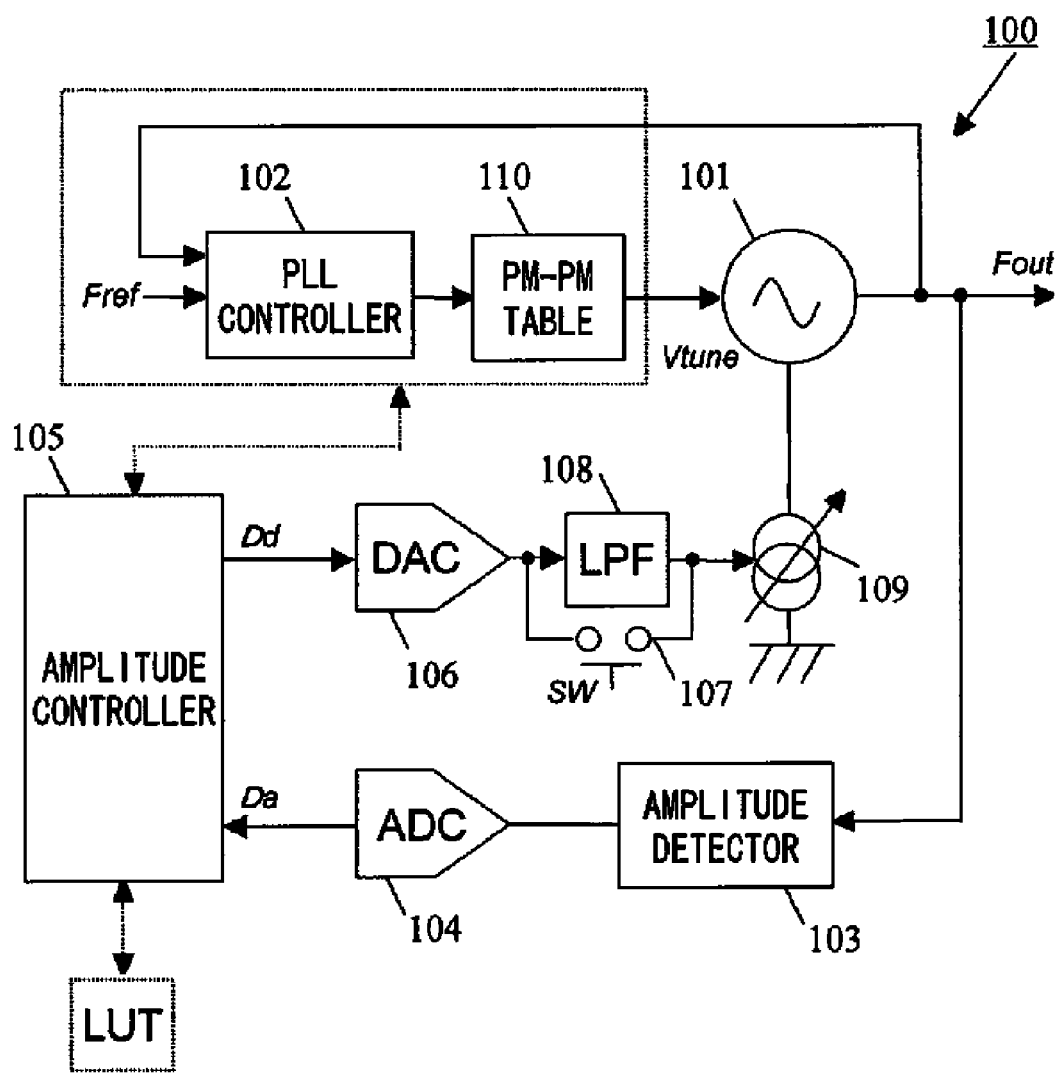

| LUT | |
|---|---|
| OUTPUT SIGNAL Da OF ADC 104 | CONTROL SIGNAL Dd |
| Da1 | Dd1 |
| Da2 | Dd2 |
| Da3 | Dd3 |
| Da4 | Dd4 |
| Da5 | Dd5 |

| PM-PM TABLE 110 | |
|---|---|
| INPUT Vtune | OUTPUT Vtune |
| V1 | V1' |
| V2 | V2' |
| V3 | V3' |
| V4 | V4' |
| V5 | V5' |

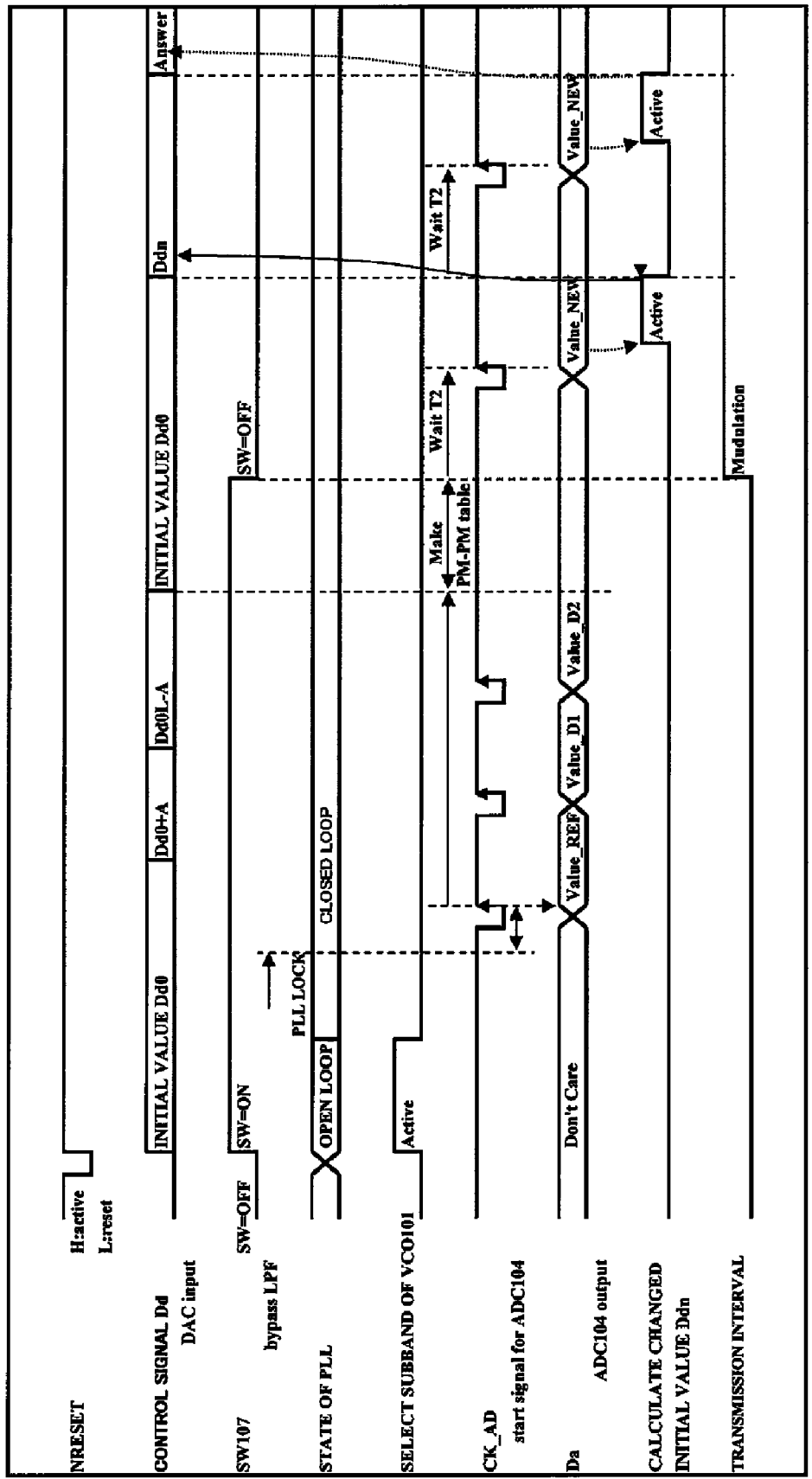

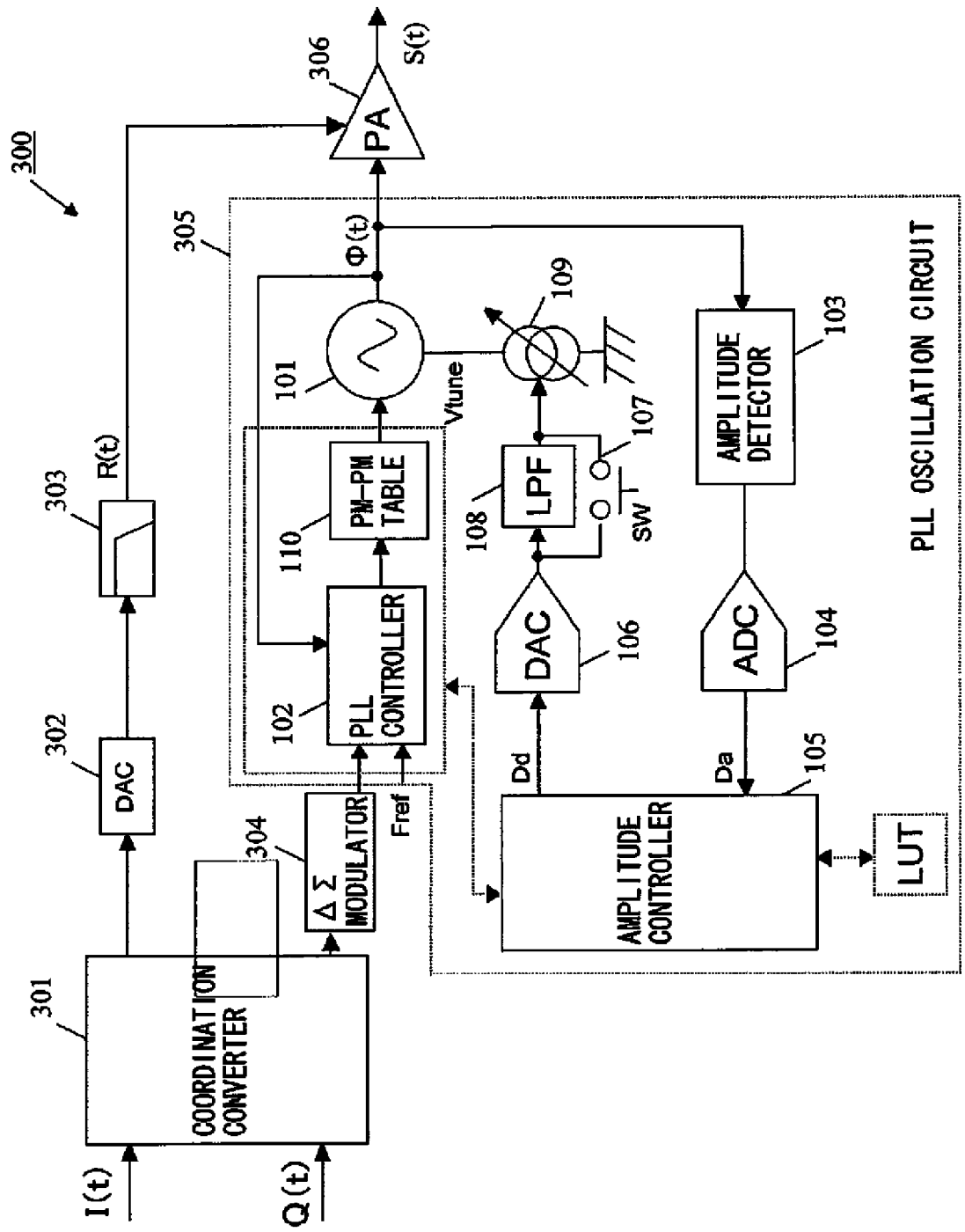
F I G. 8

F I G. 1 1
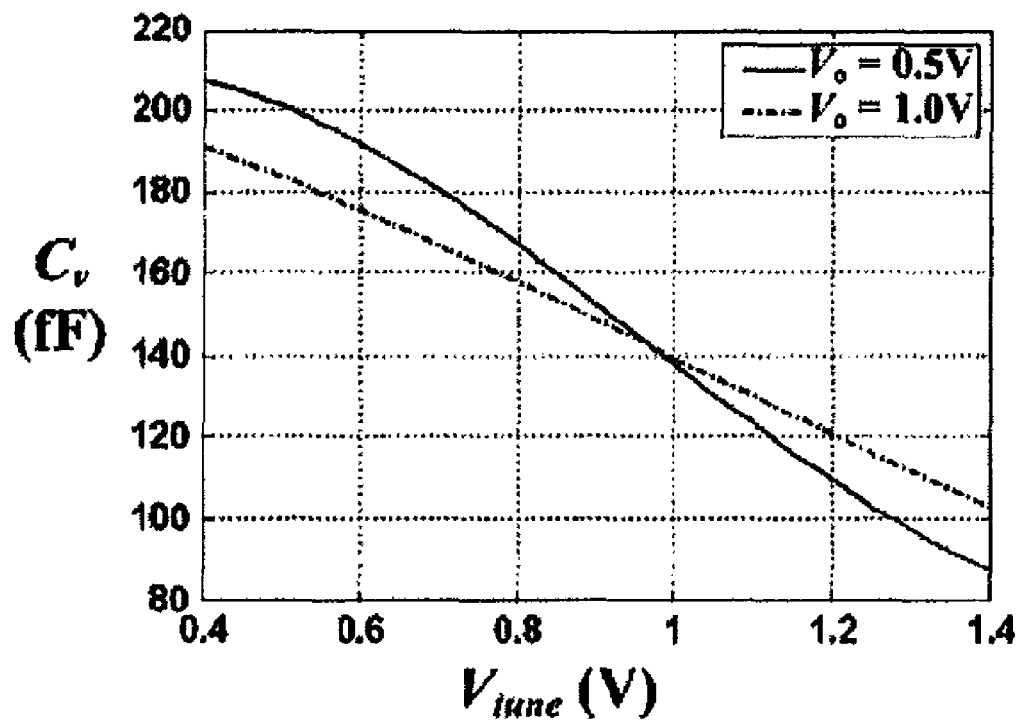
F I G. 1 2
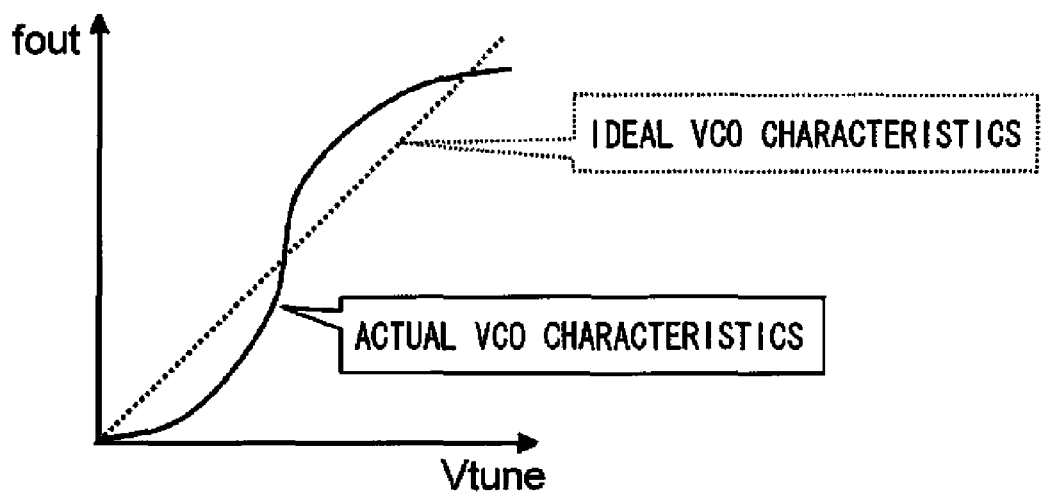

PLL OSCILLATION CIRCUIT, POLAR TRANSMITTING CIRCUIT, AND COMMUNICATION DEVICE

BACKGROUND OF THE INVENTION

1. Field of the Invention

The present invention relates to a PLL oscillation circuit. More specifically, the present invention relates to: a PLL oscillation circuit that can reduce variability of a modulation sensitivity of a voltage-controlled oscillator (VCO) and obtain a desired output amplitude quickly with high precision; and a polar transmission circuit and a communication device, both of which utilize the PLL oscillation circuit.

2. Description of the Background Art

When utilizing a voltage-controlled oscillator (VCO) in a direct modulation method, a linear modulation sensitivity of the VCO is required in order to conduct a linear frequency modulation. However, a modulation sensitivity of the VCO is generally non-linear.

Described in the following is a reason for why the modulation sensitivity of the VCO is non-linear. FIG. 10 is a figure showing one example of a circuit configuration of a VCO. In the example shown in FIG. 10, a differential cross-coupled LC oscillator is used as the VCO. FIG. 11 is a figure showing one example of C-V characteristics depending on an output amplitude Vo (Vo=Vop−Von) of the VCO. Shown here are the C-V characteristics of the VCO when the output amplitude Vo of the VCO is 0.5 V and 1.5 V. As shown in FIG. 11, a fluctuation in an average capacitance value of a MOS varactor due to a fluctuation of the output amplitude Vo of the VCO is a reason for the variability of the modulation sensitivity of the VCO.

Therefore, the input-output characteristic of the VCO becomes non-linear as shown in FIG. 12. FIG. 12 is a figure that describes the nonlinearity of the VCO. In FIG. 12, the horizontal axis represents the input voltage (Vtune) of the VCO and the vertical axis represents the output frequency (fout) of the VCO. In addition, a dotted line represents an ideal (linear) input-output characteristic of the VCO, and a solid line represents an actual (non-linear) input-output characteristic of the VCO. Ideally, it is desirable if the input-output characteristic of the VCO is linear as represented by the dotted line; however, in reality, it is generally non-linear as represented by the solid line.

Therefore, conventionally, a method that corrects the modulation sensitivity of the VCO by utilizing a PM-PM table is used. The PM-PM table is used in order to compensate for the nonlinearity of the VCO. The PM-PM table is a table for converting an input voltage (Vtune) of the VCO into the optimum value in order to allow a linear operation for a VCO having a non-linear characteristic. However, even when a PM-PM compensation of the modulation sensitivity of the VCO is conducted, the advantageous effect of the PM-PM compensation is minimized due to variability of the modulation sensitivity of the VCO caused by a temperature fluctuation and the like of the VCO, resulting in the non-linear modulation sensitivity of the VCO.

In order to deal with the above-described problem, conventionally, a circuit that corrects the modulation sensitivity of the VCO by stabilizing the output amplitude Vo of the VCO is disclosed. FIG. 13 is a figure showing one example of a conventional circuit 500 that stabilizes the output amplitude Vo of a VCO 501. In the conventional circuit 500 shown in FIG. 13, an amplitude detector 502 detects the output amplitude Vo of the VCO 501, and outputs a DC voltage corresponding to the detected output amplitude Vo of the VCO 501. An error detection amplifier 503 detects a fluctuation of the output amplitude Vo of the VCO 501 by comparing a reference voltage (Vref) and a DC voltage that corresponds to the output amplitude Vo of the VCO 501. An output signal of the error detection amplifier 503 is inputted to a variable current source 505 via a LPF 504. The variable current source 505 supplies, to the VCO 501, an electric current according to the output signal of the error detection amplifier 503. In this way, the conventional circuit 500 stabilizes the output amplitude Vo of the VCO 501.

FIG. 14A is a figure showing the relationship of an oscillation frequency and a phase noise of the VCO 501. Shown in FIG. 14A are simulation results of a phase noise (With VCO CAL) when the conventional circuit 500 is operated and a phase noise (Without VCO CAL) when the VCO 501 is operated by itself. As shown in FIG. 14A, when compared to an operation of the VCO 501 by itself, an operation of the conventional circuit 500 has a problem where the phase noise detected at a VCO 501 output is deteriorated.

It is known that a noise generated by the amplitude detector 502 is the predominant cause of the phase noise detected at the VCO 501 output. Here, the phase noise detected at the VCO 501 output is calculated by multiplying the noise, generated by the amplitude detector 502, by a closed loop transfer function (low pass function). Therefore, it is possible to improve deterioration of the phase noise by narrowing a loop bandwidth of the conventional circuit 500. FIG. 14A shows an example where the phase noise is improved when the loop bandwidth is shifted from 3 MHz to 1.8 MHz.

Narrowing the loop bandwidth of the conventional circuit 500 can improve deterioration of the phase noise; however, it is also known to deteriorate the response time necessary for the VCO 501 output to settle (i.e., response performance). FIG. 14B is a figure showing a relationship between the loop bandwidth and the response performance. FIG. 14B shows an example where a response characteristic of the VCO 501 output deteriorates when the loop bandwidth is shifted from 3 MHz to 1.8 MHz. Therefore, when the deterioration of the phase noise is improved by narrowing the loop bandwidth of the conventional circuit 500, there is a possibility that the response characteristic of the VCO 501 will not meet the requirement of a system.

Furthermore, the noise generated by the amplitude detector 502 can be reduced by increasing a device size of a transistor which is a component of the amplitude detector 502. However, it is necessary to increase the device size of the transistor substantially in order to reduce the noise to a level that meets the requirement of the system; therefore, there is a limit in reducing the noise by increasing the device size of the transistor. Furthermore, when a transistor with such a large device size is used, a load to the VCO 501 becomes extremely large and a drastic deterioration of a VCO 501 gain is inevitable.

Moreover, a conventional oscillator circuit 510 that stabilizes the output amplitude of the VCO is disclosed in Japanese National Phase PCT Laid-Open Publication No. 2004-527982 (hereinafter, referred to as patent document 1). FIG. 15 is a figure showing a conventional oscillator circuit 510 disclosed in patent document 1. In the conventional oscillator circuit 510 shown in FIG. 15, a plurality of electric current pathways (each pathway having an amplifier 512, a current source 513, and a switch 514) are connect to a LC resonator 511 (VCO) in parallel to each other, and each pathway can be individually turned on/off by the switch 514. An amplitude detector 516 detects an output amplitude of the LC resonator 511. A controller 515 stabilizes the output amplitude of the conventional oscillator circuit 510 by turning on/off a plurality of switches 514 according to an output signal of the amplitude detector 516.

However, if the conventional oscillator circuit 510 shown in FIG. 15 is applied on a system that has a continuous transmission mode, such as an UMTS and the like; when the plurality of switches 514 are switched to adjust the output amplitude, a problem arises where an unwanted radiation is generated in the output signal of the LC resonator 511 due to an operational noise.

SUMMARY OF THE INVENTION

Therefore, an objective of the present invention is to provide: a PLL oscillation circuit that can reduce the variability of modulation sensitivity of a VCO and obtain a desired output amplitude quickly with high precision; and a polar transmission circuit and a communication device, both of which utilize the PLL oscillation circuit.

The present invention is directed toward a PLL oscillation circuit that includes a reference frequency oscillator, a phase comparator, a loop filter, and a voltage-controlled oscillator. Furthermore, in order to achieve the above described objective, the PLL oscillation circuit of the present invention includes: a PM-PM table that is utilized for compensating a nonlinearity of the voltage-controlled oscillator; a variable current source connected in between the voltage-controlled oscillator and a supply potential terminal; an amplitude detector that detects an output amplitude of the voltage-controlled oscillator; an amplitude controller that controls a current value of the variable current source so as to have the output amplitude of the voltage-controlled oscillator detected by the amplitude detector to be a desired amplitude; a LPF connected in between the amplitude controller and the variable current source; and a switch that connects or disconnects the LPF between the amplitude controller and the variable current source.

When switching an output frequency of the voltage-controlled oscillator, a connection of the switch is turned on, so as to connect the amplitude controller to the variable current source through the switch, and to update a setting value in the PM-PM table to be a value that corresponds to an output frequency after the switching; and when the voltage-controlled oscillator outputs a desired frequency signal, the connection of the switch is turned off and the amplitude controller is connected to the variable current source through the LPF.

A period, in which the connection of the switch is turned on, is within a non-transmission slot during switching of the output frequency of the voltage-controlled oscillator.

Preferably, when switching the output frequency of the voltage-controlled oscillator, the amplitude controller: outputs a predefined initial value; outputs, at least once, a changed initial value which is obtained by changing the initial value; and controls, when the initial value and the changed initial value are outputted, a current value of the variable current source so as to have the output amplitude of the voltage-controlled oscillator detected by the amplitude detector to be a desired amplitude, based on a fluctuation of the output amplitude of the voltage-controlled oscillator detected by the amplitude detector.

The amplitude controller calculates, when switching the output frequency of the voltage-controlled oscillator, a coefficient that indicates a relationship between, a fluctuation range of the output amplitude of the voltage-controlled oscillator and a fluctuation range of the control signal outputted from the variable current source. The amplitude controller controls, when the voltage-controlled oscillator outputs a desired frequency signal, a current value of the variable current source so as to have the output amplitude of the voltage-controlled oscillator detected by the amplitude detector to be a desired amplitude, based on the calculated coefficient.

Preferably, the amplitude controller calculates the coefficient by: detecting a first output amplitude value of the voltage-controlled oscillator detected by the amplitude detector, when a value obtained by adding the initial value to a predefined value is outputted; detecting a second output amplitude value of the voltage-controlled oscillator detected by the amplitude detector, when a value obtained by subtracting the predefined value from the initial value is outputted; and dividing a value, obtained by multiplying the predefined value with two, with another value obtained by subtracting the second output amplitude value from the first output amplitude value.

Furthermore, the amplitude controller may control, when the voltage-controlled oscillator outputs a desired frequency signal, a current value of the variable current source so as to have the output amplitude of the voltage-controlled oscillator detected by the amplitude detector to be a desired amplitude, based on the coefficient that indicates the relationship between the fluctuation range of the output amplitude of the voltage-controlled oscillator stored in advance and the fluctuation range of the control signal outputted from the variable current source.

The amplitude controller may control a current value of the variable current source so as to have the output amplitude of the voltage-controlled oscillator detected by the amplitude detector to be a desired amplitude, by referencing a LUT configured in advance.

Preferably, the PLL oscillation circuit further includes an ADC which conducts a digital conversion of an output signal of the amplitude detector, and which is interposed between the amplitude detector and the amplitude controller. Furthermore, the PLL oscillation circuit further includes a DAC which conducts an analog conversion or an output signal of the amplitude controller, and which is interposed between the amplitude controller and the variable current source.

Furthermore, the present invention is also directed toward a polar transmission circuit. In order to achieve the above-described objective, the polar transmission circuit of the present invention includes: a coordination converter that converts an input data into an amplitude signal and a phase signal; a DAC that conducts an analog conversion of the amplitude signal; a filter that removes a noise from the amplitude signal that is inputted through the DAC; a $\Delta\Sigma$ modulator that $\Delta\Sigma$ modulates the phase signal; either one of the above described PLL oscillation circuits that outputs a signal with a frequency according to the phase signal inputted through the $\Delta\Sigma$ modulator; and a PA that amplifies an output signal of the PLL oscillation circuit according to an output signal of the filter, and outputs the resulting signal as a transmission signal.

Furthermore, the present invention is also directed toward a communication device. The communication device includes: a transmission circuit that generates a transmission signal; and an antenna that outputs the transmission signal generated by the transmission circuit. The transmission circuit includes either one of PLL oscillation circuits described above. Additionally, the communication device may further include: a reception circuit that processes a reception signal received from the antenna; and an antenna duplexer which outputs the transmission signal generated by the transmission circuit to the antenna, and which outputs the reception signal received from the antenna to the reception circuit.

As described above, by using the PLL oscillation circuit according to the present invention, an influence of a noise generated at the amplitude detector can be reduced by having the ADC conduct a digital conversion on the output signal of the amplitude detector. Furthermore, a response speed of the circuit during channel switching can be accelerated, by turning on the switch during channel switching of the VCO, leading to disengagement of the connection to the LPF. In addition, generation of an unwanted radiation can be prevented without sacrificing the response speed during channel switching, by turning off the switch when the VCO is outputting a desired channel signal, and engaging the connection to the LPF. By this, the PLL oscillation circuit can reduce the variability of modulation sensitivity of the VCO and obtain a desired output amplitude quickly with high precision.

Furthermore, since the PLL oscillation circuit calculates the optimum coefficient a1 for each circuit during channel switching of the VCO, the output amplitude of the VCO can be stabilized quickly with high precision. In addition, by conducting the calculation of the optimum coefficient a1 for each circuit in advance, such as when powering-on the circuit, the output amplitude of the VCO can be stabilized even more quickly.

Furthermore, by applying the PLL oscillation circuit described above to the transmission circuit of the present invention, it is possible to output the transmission signal with high precision. In addition, by applying the transmission circuit described above to the communication device of the present invention, operation can be conducted with low distortion and high efficiency throughout a wide range of output power.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing one example of a PLL oscillation circuit 100 according to the first embodiment of the present invention;

FIG. 7 is a figure showing a timing chart of the PLL oscillation circuit 200 according to the second embodiment of the present invention;

FIG. 8 is a block diagram showing one configuration example of a polar transmission circuit 300 according to a third embodiment of the present invention;

FIG. 11 is a figure showing one example of C-V characteristics, according to an output amplitude Vo of a VCO;

FIG. 12 is a figure for describing nonlinearity of a VCO;

DESCRIPTION OF THE PREFERRED EMBODIMENTS

First Embodiment

Figure 2:
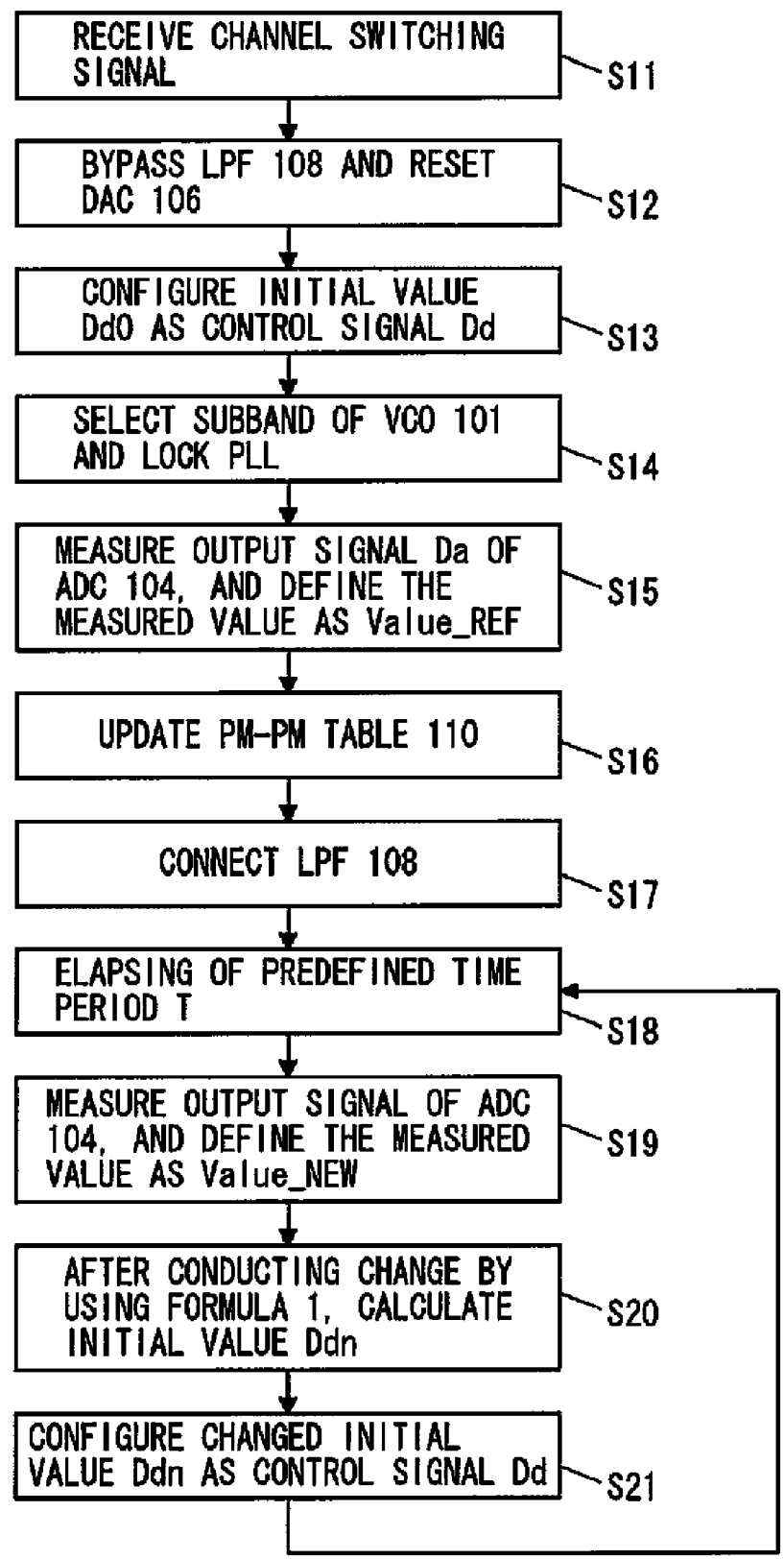
FIG. 2 is a flowchart showing one example of the operation of the PLL oscillation circuit 100 according to the first embodiment of the present invention.

FIG. 1 is a block diagram showing one example of a PLL oscillation circuit 100 according to a first embodiment of the present invention. In FIG. 1, the PLL oscillation circuit 100 includes: a voltage-controlled oscillator (VCO) 101; a PLL controller 102; an amplitude detector 103; an ADC 104; an amplitude controller 105; a DAC 106; a switch 107; a LPF 108; a variable current source 109; and a PM-PM table 110.

The PLL controller 102 outputs a frequency control signal (Vtune) in order to control an output frequency of the VCO 101. The frequency control signal (Vtune) outputted from the PLL controller 102 is inputted in the VCO 101 via the PM-PM table 110. The PM-PM table 110 is used for compensating a nonlinearity of the VCO 101. The PM-PM table 110 is a table used for converting the frequency control signal (Vtune) inputted to the VCO 101 into the optimum value in order to allow a non-linear VCO 101 conduct a linear operation. When a channel (output frequency) of the VCO 101 is switched, the PM-PM table 110 is updated to be the optimum value that corresponds to a channel after switching.

The VCO 101 outputs a desired frequency signal according to the frequency control signal (Vtune) that is inputted through the PM-PM table 110. The VCO 101 is supplied with a current having a certain value by the variable current source 109. The amplitude detector 103 detects an output amplitude of the VCO 101, and outputs an output signal according to the detected output amplitude of the VCO 101. The ADC 104 conducts a digital conversion on an output signal of the amplitude detector 103. An output signal Da of the ADC 104 is inputted to the amplitude controller 105.

Preferably, the ADC 104 conducts a digital conversion on the output signal of the amplitude detector 103 with a coarse resolution, to a level where a noise generated by the amplitude detector 103 is not reflected in the ADC 104. As a result, the overall influence of the noise generated by the amplitude detector 103 can be reduced. This is because if the resolution of the ADC 104 is coarse, to a certain level, than the noise generated by the amplitude detector 103, the noise generated by the amplitude detector 103 is buried below the resolution of the ADC 104. For example, when the noise generated by the amplitude detector 103 is 100 nV and the precision of the ADC 104 is approximately around 2 mV, the noise generated by the amplitude detector 103 is not reflected in the ADC 104.

The amplitude controller 105 controls a current value of the variable current source 109 so as to have the output amplitude of the VCO 101 detected by the amplitude detector 103 to be a desired amplitude. More specifically, the amplitude controller 105 outputs a control signal Dd to control the current value supplied to the VCO 101 from the variable current source 109, based on the output signal Da of the ADC 104. The DAC 106 conducts an analog conversion of the control signal Dd outputted from the amplitude controller 105. The LPF 108 removes a spurious emission from the control signal Dd that is inputted through the DAC 106, and prevents the generation of an unwanted radiation.

The switch 107 connects or disconnects the LPF 108 between the DAC 106 and the variable current source 109. More specifically, the switch 107 is turned on when the channel (output frequency) of the VCO 101 is switched. In this case, the DAC 106 and the variable current source 109 are connected through the switch 107. On the other hand, the switch 107 is turned off when the VCO 101 outputs a desired channel (desired frequency) signal. In this case, the DAC 106 and the variable current source 109 are connected through the LPF 108. The reason why the switch 107 is turned on in order to disengage the connection of the LPF 108 when the channel (i.e., output frequency) of the VCO 101 is switched, is to accelerate a response speed of the circuit during channel switching. The response speed of the circuit is slightly reduced by connecting the LPF 108 when the VCO 101 outputs a desired channel (desired frequency) signal. However, since a high adaptability against a temperature fluctuation of the VCO 101 is not necessary, therefore, the response speed of the circuit will not be a problem in this case. Thus, by connecting or disconnecting the LPF 108 by means of the switch 107, the PLL oscillation circuit 100 can prevent the generation of an unwanted radiation without sacrificing the response speed during channel switching.

The variable current source 109 supplies the VCO 101 with a current having a value that depends on the control signal Dd outputted from the amplitude controller 105.

The PLL oscillation circuit 100 may have a configuration that does not include the ADC 104 and the DAC 106. For example, the PLL oscillation circuit 100 does not necessary have to include the ADC 104 if the amplitude detector 103 outputs a digital signal. Alternatively, even when the amplitude detector 103 outputs an analog signal, the ADC 104 does not necessary have to be included if the amplitude controller 105 is constructed from analog processing elements. Additionally, the PLL oscillation circuit 100 does not necessary have to include the DAC 106 if the amplitude controller 105 outputs an analog signal. Alternatively, even when the amplitude controller 105 outputs a digital signal, the DAC 106 does not necessary have to be included if the LPF 108 and the variable current source 109 are constructed from analog processing elements.

Figure 3:
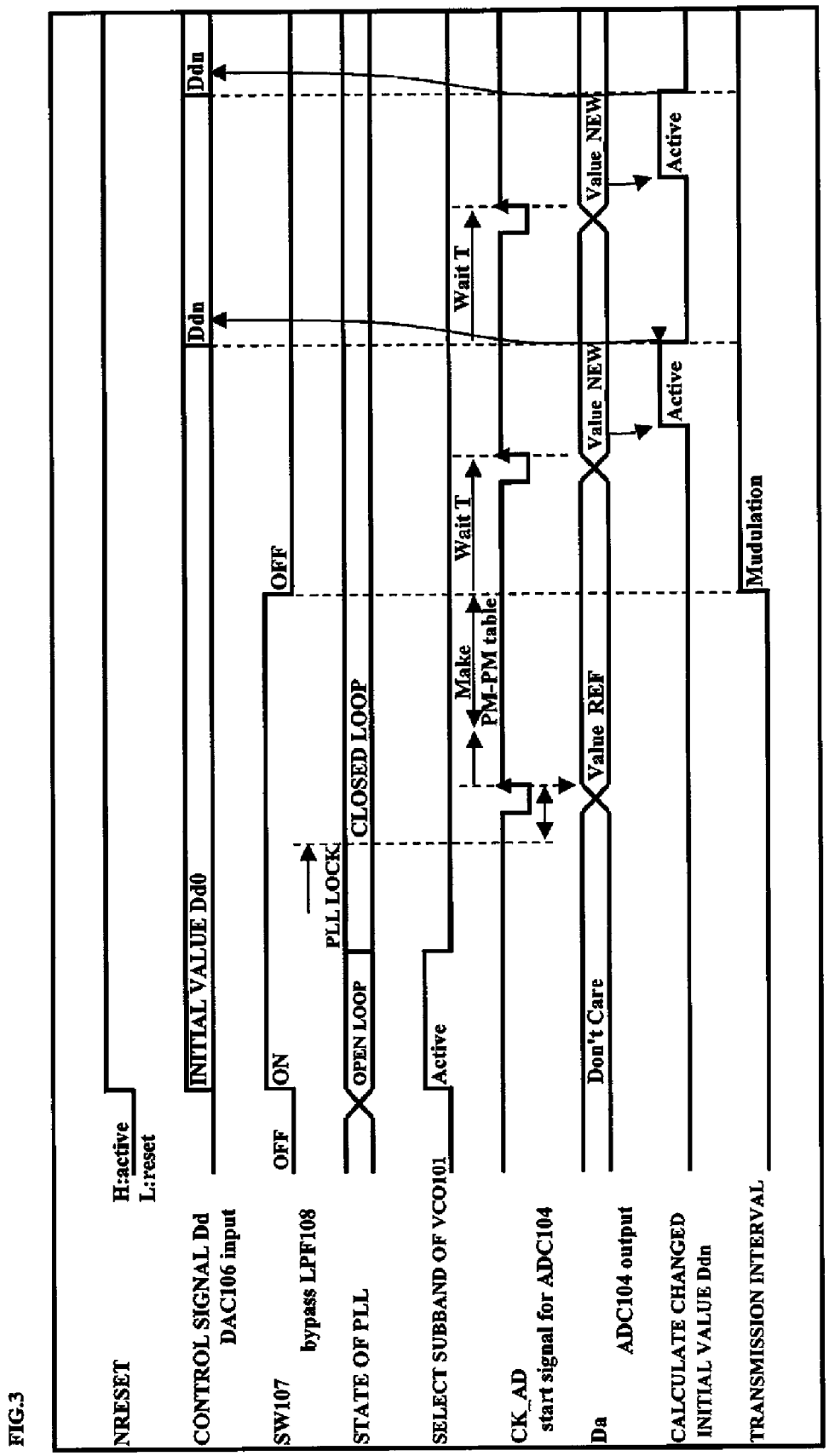
FIG. 3 is a figure showing a timing chart of the PLL oscillation circuit 100 according to the first embodiment of the present invention.

The operation of the PLL oscillation circuit 100 according to the first embodiment of the present invention is describe next with reference to FIG. 2 and FIG. 3. FIG. 2 is a flowchart showing one example of the operation of the PLL oscillation circuit 100 according to the first embodiment of the present invention. FIG. 3 is a figure showing a timing chart of the PLL oscillation circuit 100 according to the first embodiment of the present invention. As described in FIG. 2 and FIG. 3, when the amplitude controller 105 receives a channel switching signal from a base station (step S11): the switch 107 is turned on and the LPF 108 is bypassed, a reset signal (NRESET) is outputted to the DAC 106, and the DAC 106 is reset (step S12). As a result, the DAC 106 and the variable current source 109 are connected not through the LPF 108, and an output of the DAC 106 is initialized.

Next, the amplitude controller 105 configures an initial value Dd0 to be the control signal Dd, and outputs the initial value Dd0 to the DAC 106 (step S13). The initial value Dd0 may be a single value that is already configured before being shipped out from a factory, or may be a plurality of values that corresponds to channel switching signals in order to improve precision. In this embodiment, the amplitude controller 105 stores the initial value Dd0 in the LUT or the like in advance. At this point, the PLL controller 102 selects a subband of the VCO 101 and locks a PLL (step S14).

At this moment, the amplitude detector 103 detects the output amplitude of the VCO 101, and the ADC 104 conducts a digital conversion on the output signal of the amplitude detector 103. The output signal Da of the ADC 104 is inputted to the amplitude controller 105. The amplitude controller 105 measures the voltage of the output signal Da or the ADC 104 (step S15). The obtained measured value is defined as a reference value Value_REF. If necessary, the amplitude controller 105 updates the PM-PM table at this point when the switch 107 is turned on (step S16). The updating method of the PM-PM table 110 will be described in the following.

The amplitude controller 105 turns off the switch 107, and connects the LPF 108 in between the DAC 106 and the variable current source 109 (step S17). The time required for updating the PM-PM table 110 can be reduced, by having the PLL oscillation circuit 100 update the PM-PM table 110 when the switch 107 is turned on. As a result, the time required for channel switching (time required for: turning on the switch 107, updating the PM-PM table 110, turning off the switch 107, and transmitting a signal) can be reduced. More specifically, it is necessary to end the channel switching operation within a non-transmission slot (differs depending on the system in which this invention is applied, nevertheless, around 200 μsec to 250 μsec).

Next, after a predefined time period T has elapsed from the time when the switch 107 is turned off (step S18), the amplitude controller 105 measures the voltage of the output signal Da of the ADC 104 (step S19). The obtained measured value is defined as Value_NEW. Although the predefined time period T differs depending on the system in which this invention is applied, the predefined time period T is, for example, configured to be around 660 μsec to 20 msec.

The amplitude controller 105 calculates a changed initial value Ddn by using formula 1 (step S20). The coefficient a1 in formula 1 is a value indicating the relationship between the fluctuation range of the output amplitude of the VCO 101 and the fluctuation range of the control signal Dd; and the coefficient a1 for each sample is configured, for example, before being shipped out from a factory. The amplitude controller 105 configures the control signal Dd to be the calculated changed initial value Ddn; and outputs the control signal Dd to the variable current source 109 via the DAC 106 and the LPF 108 (step S21).

Changed Initial Value $Ddn$=Control Signal $Dd$−(Value_NEW−Value_REF)·Coefficient $a1$  (Formula 1)

After this, the operation from step S18 to step S21 repeats, every time the predefined time period T elapses. As a result, the PLL oscillation circuit 100 can reduce, after the PLL is locked, an output amplitude fluctuation of the VCO 101 caused by temperature fluctuation.

By conducting the process described above with referencing to FIG. 2, the PLL oscillation circuit 100 may store, in the LUT (refer FIG. 4), the optimum control signal Dd value that corresponds to the output signal Da of the ADC 104. As a result, by referencing the LUT, the PLL oscillation circuit 100 can control a current value of the variable current source 109 so as to have the output amplitude of the VCO 101 to be a desired amplitude.

Described next is one example of the updating method of the PM-PM table 110. When the switch 107 is turned on during channel switching of the VCO 101, the amplitude controller 105 alters the frequency control signal (Vtune) by using the PLL controller 102. The PM-PM table 110 is updated so as to include the optimum value resulting from the alteration of the output frequency of the VCO 101. Although the amplitude controller 105 updates the PM-PM table 110 in the description above, the PLL controller 102 or an additionally provided controller may conduct the update.

More specifically, the PLL controller 102 is utilized for obtaining a signal (fout) having an output frequency that is integral multiple of a reference signal (Fref). As a result, formula 2 is satisfied at a steady state when the PLL is locked. Here, N is an arbitrary integer, and the reference signal (Fref) is constant. Formula 2 is satisfied whether the VCO 101 is linear or non-linear.

$$fout = N \times Fref \quad \text{(Formula 2)}$$

Figures 4, 5A:
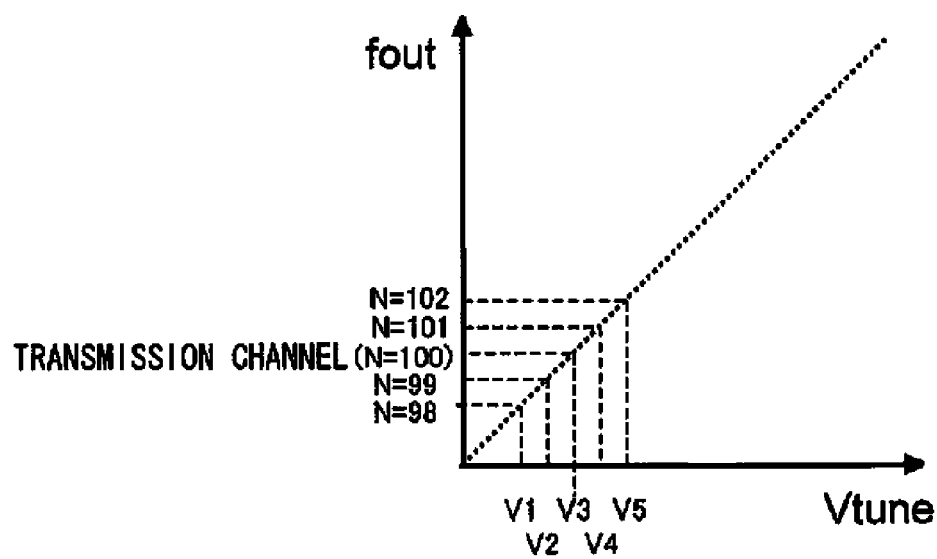
FIG. 4 is a figure showing one example of a LUT that stores values of an output signal Da and a control signal Dd.
FIG. 5A is a figure showing a relationship between an integer N and a control voltage Vtune when a linear VCO 101 is used.
Figures 5B, 5C:
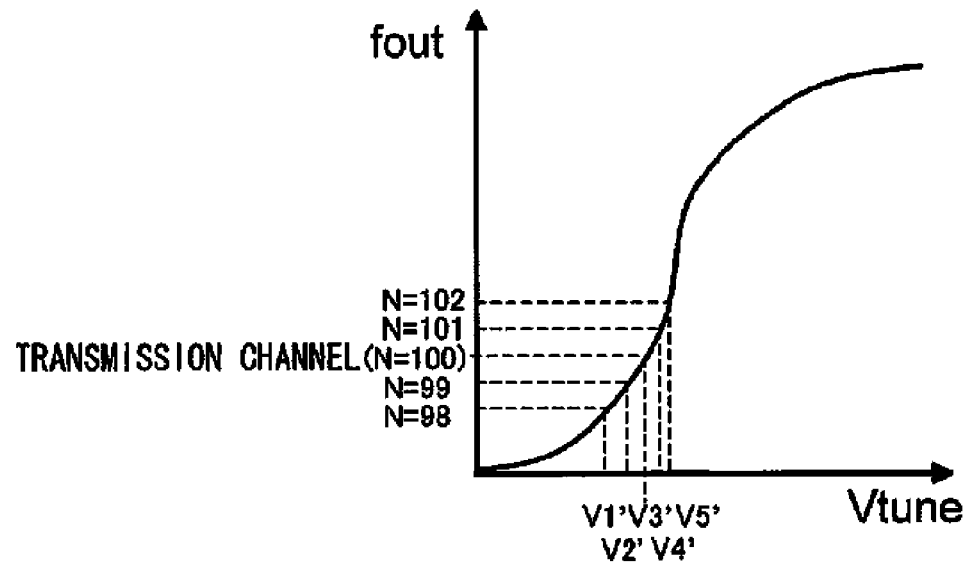
FIG. 5B is a figure showing a relationship between the integer N and the control voltage Vtune when a non-linear VCO 101 is used.
FIG. 5C is a figure showing a specific example of a PM-PM table 110.

FIG. 5A is a figure showing a relationship between an integer N and a control voltage Vtune when an ideal (linear) VCO 101 is used. FIG. 5B is a figure showing a relationship between the integer N and the control voltage Vtune when an actual (non-linear) VCO 101 is used. In this example, a transmission channel after switching is assumed to be 100 (N=100). The PLL controller 102 alters the integer N from 98 to 102 when the switch 107 is turned on during channel switching of the VCO 101.

As shown in FIG. 5A, when the integer N (98 to 102) is altered, intervals of control voltages Vtune (V1 to V5) which depend on output frequencies fout should be equal if a linear VCO 101 is used. On the other hand, as shown in FIG. 5B, when the integer N (98 to 102) is altered, intervals of control voltages Vtune (V1' to V5') which depend on output frequencies are not equal if a non-linear VCO 101 is used. The PM-PM table 110 is generated by utilizing the difference between FIG. 5A and FIG. 5B. More specifically, the PM-PM table 110 (refer FIG. 5C) is generated such that V1' to V5' shown in FIG. 5B will be outputted when V1 to V5 shown in FIG. 5A are inputted respectively.

As described above, by using the PLL oscillation circuit 100 according to the first embodiment of the present invention, the influence of the noise generated at the amplitude detector 103 can be reduced by having the ADC 104 conduct a digital conversion on the output signal of the amplitude detector 103. Furthermore, the response speed of the circuit during channel switching can be accelerated, by turning on the switch 107 during channel switching of the VCO 101, leading to disengagement of the connection to the LPF 108. In addition, generation of the unwanted radiation can be prevented without sacrificing the response speed during channel switching, by turning off the switch 107 when the VCO 101 is outputting a desired channel signal, and engaging the connection to the LPF 108. By this, the PLL oscillation circuit 100 can reduce the variability of modulation sensitivity of the VCO 101, and obtain a desired output amplitude quickly with high precision.

Second Embodiment

The PLL oscillation circuit 100 according to the first embodiment uses a value that is configured before being shipped out from a factory for each sample, as the coefficient a1 used in formula 1. As a result, there are cases where it takes a long period of time to reach a desired output amplitude, due to an error of the coefficient a1 originating from individual variability of the circuits. Therefore, when compared to the PLL oscillation circuit 100 according to the first embodiment, a PLL oscillation circuit 200 according to a second embodiment includes an additional procedure that calculates the optimum coefficient a1 for each circuit.

Figure 6A:
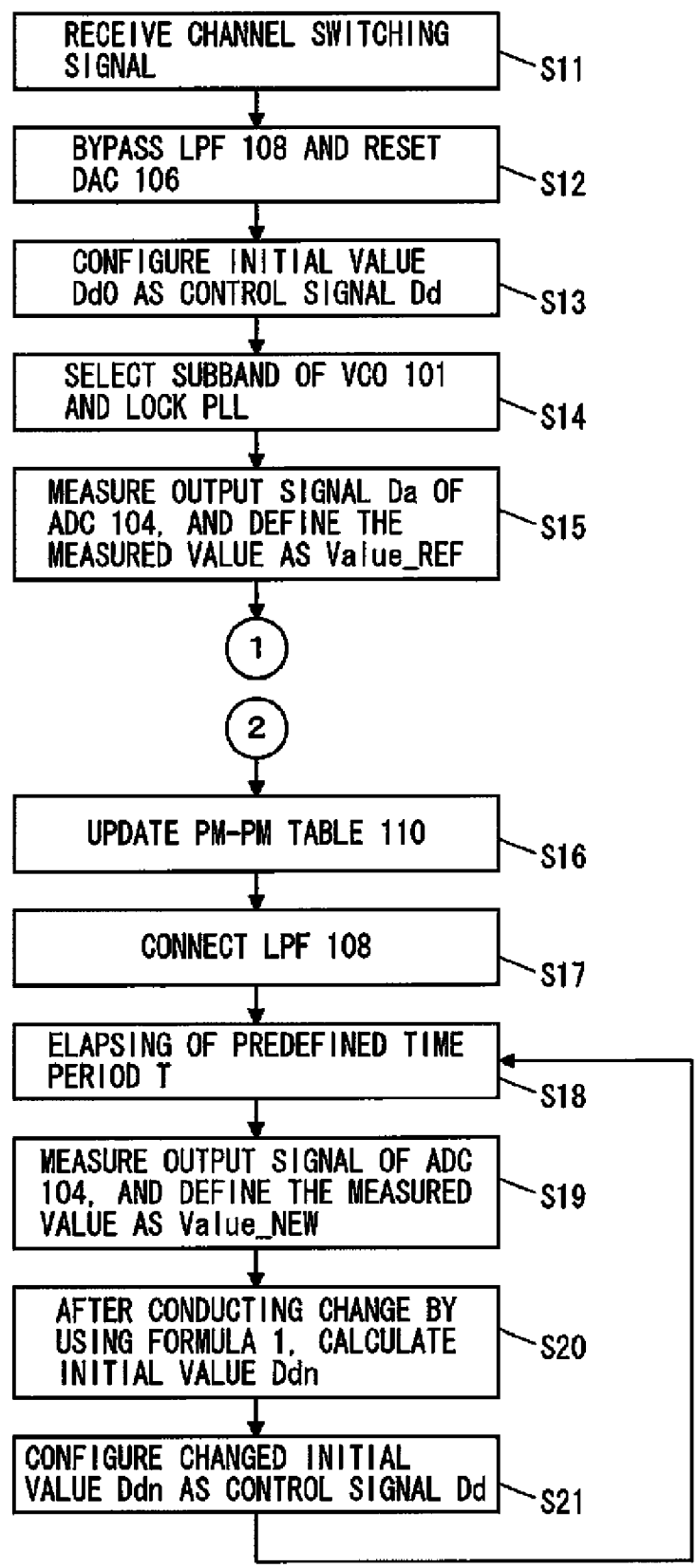
FIG. 6A is a flowchart showing one example of the operation of a PLL oscillation circuit 200 according to a second embodiment of the present invention.
Figure 6B:
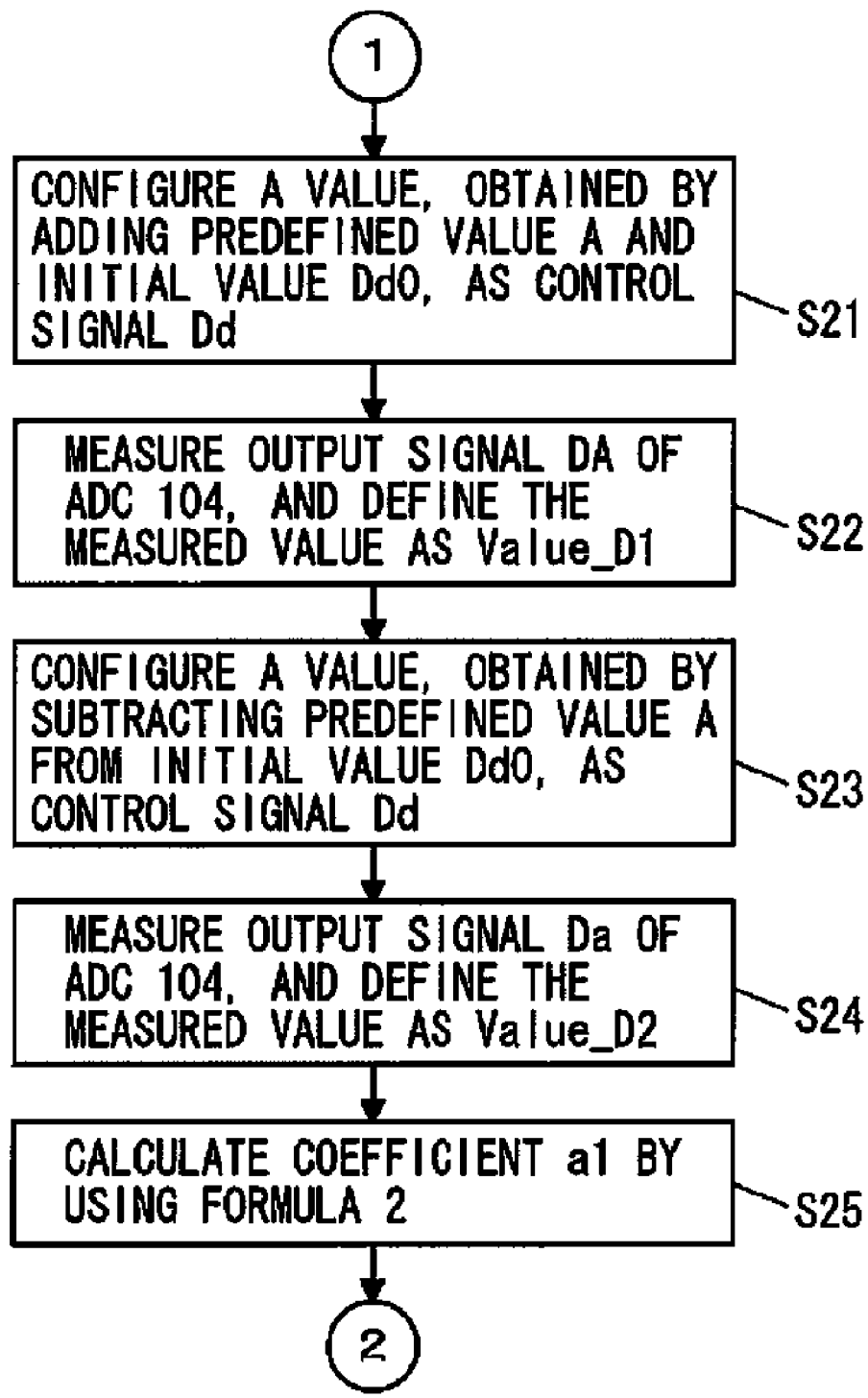
FIG. 6B is a flowchart showing one example of the operation of the PLL oscillation circuit 200 according to the second embodiment of the present invention.

The operation of the PLL oscillation circuit 200 according to the second embodiment of the present invention is describe with reference to FIG. 6A, FIG. 6B, and FIG. 7. FIG. 1 describing the configuration of the PLL oscillation circuit 100 according to the first embodiment is also used for describing the configuration of the PLL oscillation circuit 200 according to the second embodiment, since the PLL oscillation circuit 100 and the PLL oscillation circuit 200 have similar configurations. FIG. 6A and FIG. 6B are flowcharts showing one example of the operation of the PLL oscillation circuit 200 according to the second embodiment of the present invention. FIG. 7 is a figure showing a timing chart of the PLL oscillation circuit 200 according to the second embodiment of the present invention. In FIG. 6A, the operations from step S11 to step S15, and from step S16 to step S22 are identical to those described in FIG. 2 for the first embodiment, thus the descriptions of these operations are omitted.

As described in FIG. 6B and FIG. 7, after measuring the output signal Da of the ADC 104 step S15), the amplitude controller 105 configures the control signal Dd to be a value obtained by adding the initial value Dd0 and a predefined value A (step S21). At this moment, the amplitude detector 103 detects the output amplitude of the VCO 101, and the ADC 104 conducts a digital conversion on the output signal of the amplitude detector 103. The output signal Da of the ADC 104 is inputted to the amplitude controller 105. The amplitude controller 105 measures the voltage of the output signal Da of the ADC 104 (step S22). The obtained measured value is defined as Value_D1.

Next, the amplitude controller 105 configures the control signal Dd to be a value obtained by subtracting the predefined value A from the initial value Dd0 (step S23). At this moment, the amplitude detector 103 detects the output amplitude of the VCO 101, and the ADC 104 conducts a digital conversion on the output signal of the amplitude detector 103. The output signal Da of the ADC 104 is inputted to the amplitude controller 105. The amplitude controller 105 measures the voltage of the output signal Da of the ADC 104 (step S24). The obtained measured value is defined as Value_D2.

Next, the amplitude controller 105 calculates the value of the coefficient a1 by using formula 3 (step S25).

$$\text{Coefficient } a1 = 2A/(\text{Value\_D1} - \text{Value\_D2}) \quad \text{(Formula 3)}$$

As described above, by using the PLL oscillation circuit 200 according to the second embodiment of the present invention, the output amplitude of the VCO 101 can be stabilized more quickly with higher precision when compared to the first embodiment, by calculating the optimum coefficient a1 for each circuit during channel switching of the VCO 101.

Furthermore, in the description above, although the calculation process (step S21 to S25) of the coefficient a1 is conducted after step S15, the output amplitude of the VCO 101 can be stabilize even more quickly, by conducting this process in advance, such as when powering-on the circuit. Moreover, in case the coefficient a1 is altered according to the frequency control signal (Vtune), the coefficient a1 is preferably calculated at a plurality of time points when the frequency control signal (Vtune) is altered.

Third Embodiment

FIG. 8 is a block diagram showing one configuration example of a polar transmission circuit 300 according to a third embodiment of the present invention. As described in FIG. 8, the polar transmission circuit 300 according to the third embodiment includes: a coordination converter 301; a DAC 302; a filter 303; a ΔΣ modulator 304; a PLL oscillation circuit 305; and a PA 306. The PLL oscillation circuit described in either the First or second embodiment is used as the PLL oscillation circuit 305.

An I/Q data, which is an orthogonal data, is inputted in the coordination converter 301 of the polar transmission circuit 300. The coordination converter 301 converts the I/Q data, which are orthogonal data, into an amplitude signal and a phase signal, which are polar coordinates data. The amplitude signal is: converted into an analog signal by the DAC 302; passed through the filter 303 to attenuated an unnecessary folding noise of the DAC 302; and provided to the PA 306. The phase signal is: ΔΣ modulated by the ΔΣ modulator 304; and inputted to the PLL oscillation circuit 305. The PLL oscillation circuit 305 outputs a frequency signal according to the phase signal inputted through the ΔΣ modulator 304.

When the I/Q data inputted to the coordination converter 301 are represented as I(t) and Q(t), an output signal R(t) of the filter 303 can be represented by using formula 4. Furthermore, an output signal φ(t) of the PLL oscillation circuit 305 can be represented by using formula 5. Additionally, an output signal S(t) of the PA 306 can be represented by using formula 6. Here, arbitrary values are used as α and β.

$$R(t) = \alpha \sqrt{I(t)^2 + Q(t)^2} \quad \text{(Formula 4)}$$

$$\phi(t) = \arctan\left(\frac{Q(t)}{I(t)}\right) \quad \text{(Formula 5)}$$

$$S(t) = \beta * R(t) * \cos(\omega_0 + \phi(t)) \quad \text{(Formula 6)}$$

Fourth Embodiment

Figure 9:
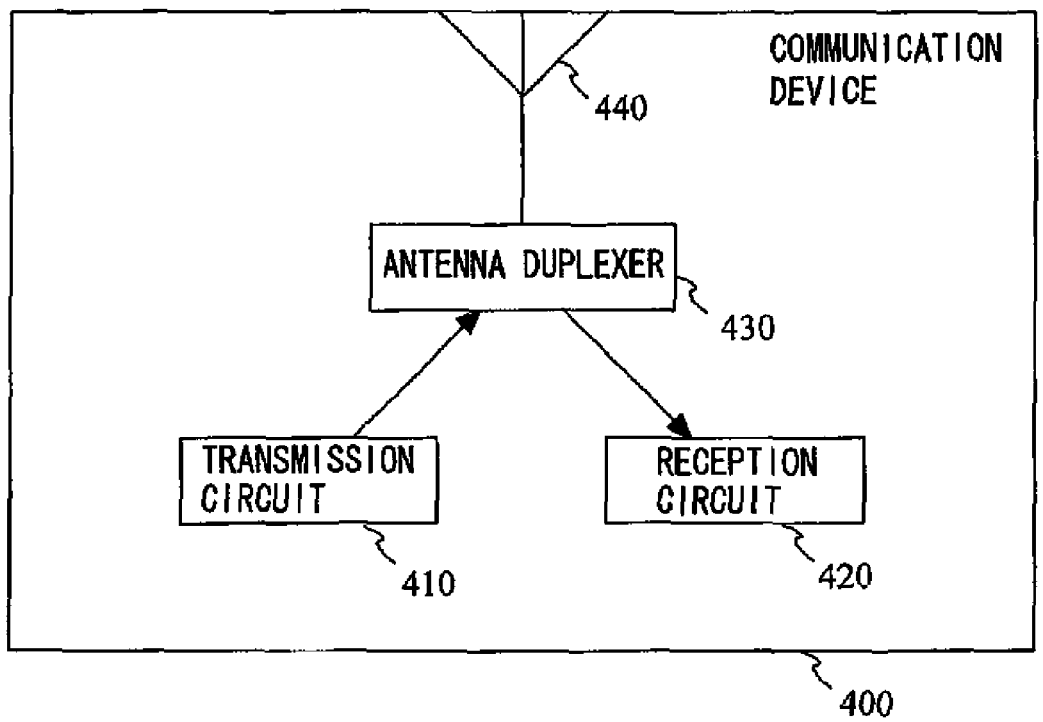
FIG. 9 is a block diagram showing one configuration example of a communication device 400 according to a fourth embodiment of the present invention.
Figure 10:
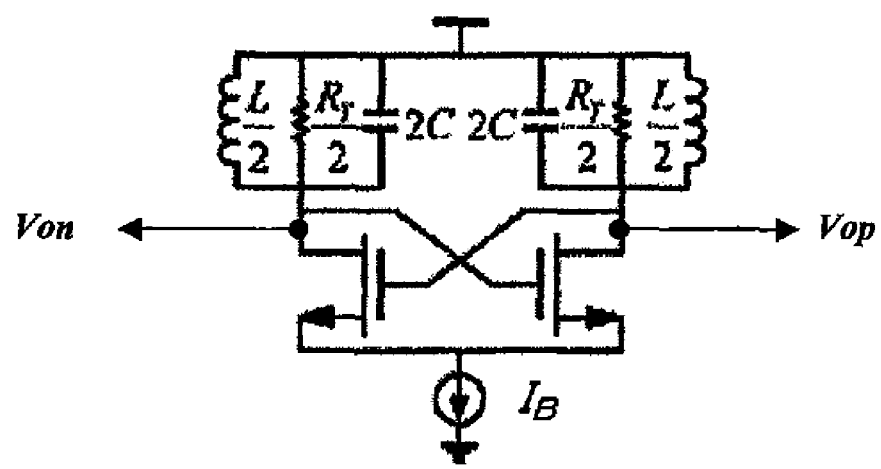
FIG. 10 is a figure showing one example of a circuit configuration of a VCO.
Figure 13:
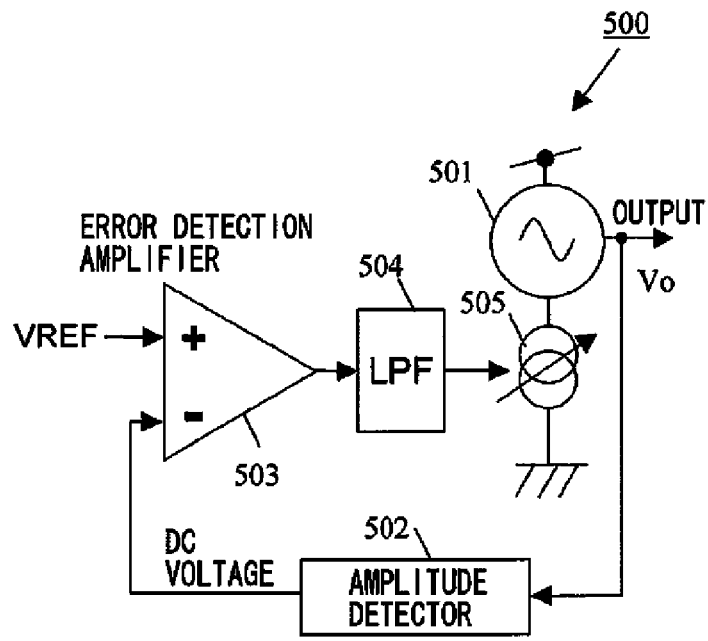
FIG. 13 is a figure showing one example of a conventional circuit 500 that stabilizes an output amplitude Vo of a VCO 51.
Figure 14A:
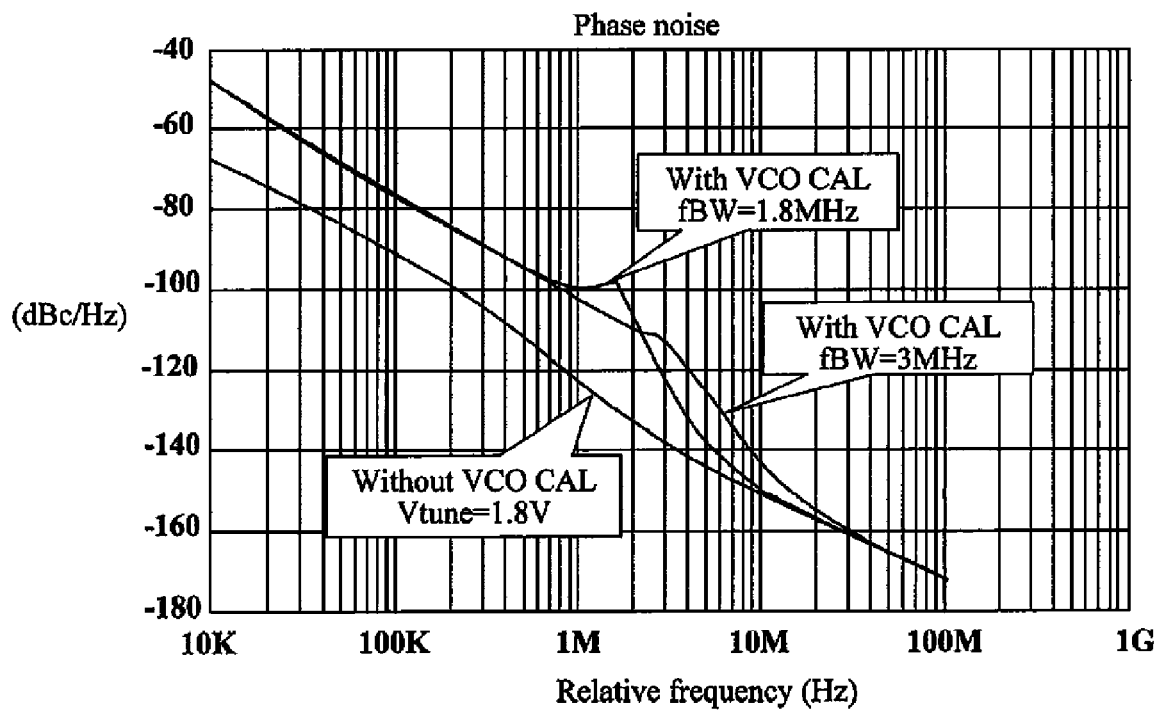
FIG. 14A is a figure showing a relationship between a phase noise and an oscillation frequency of a VCO 501.
Figure 14B:
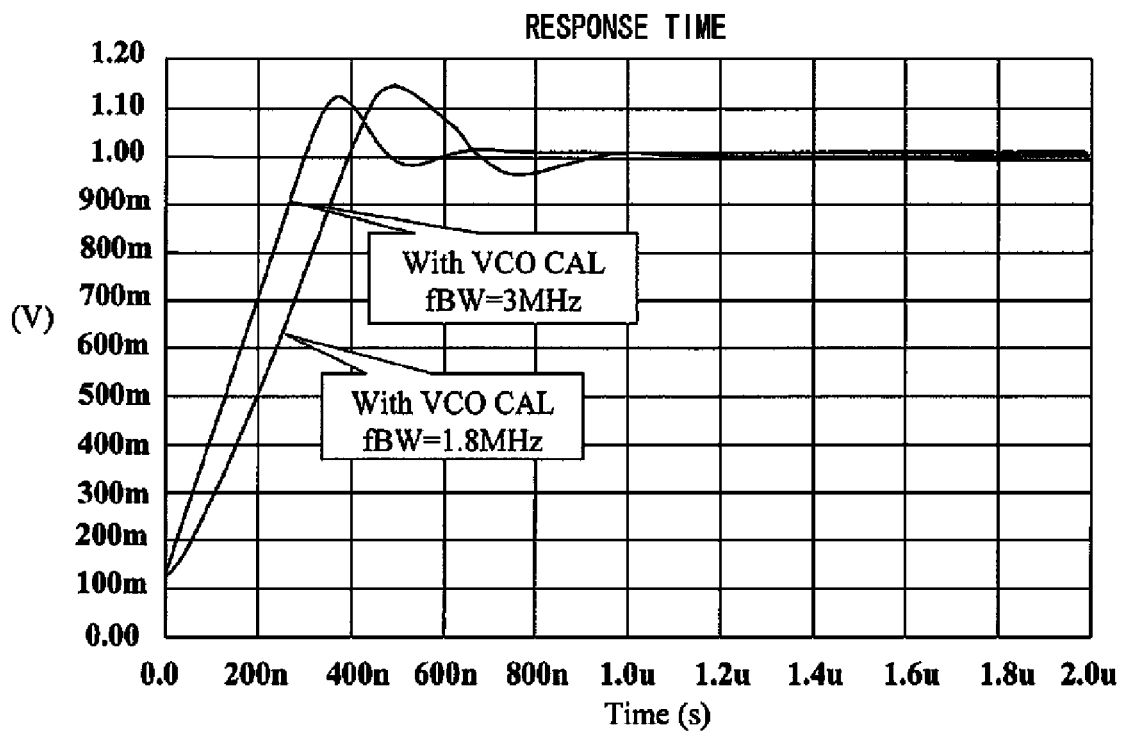
FIG. 14B is a figure showing an example where a response characteristic of a VCO 501 output deteriorates.
Figure 15:
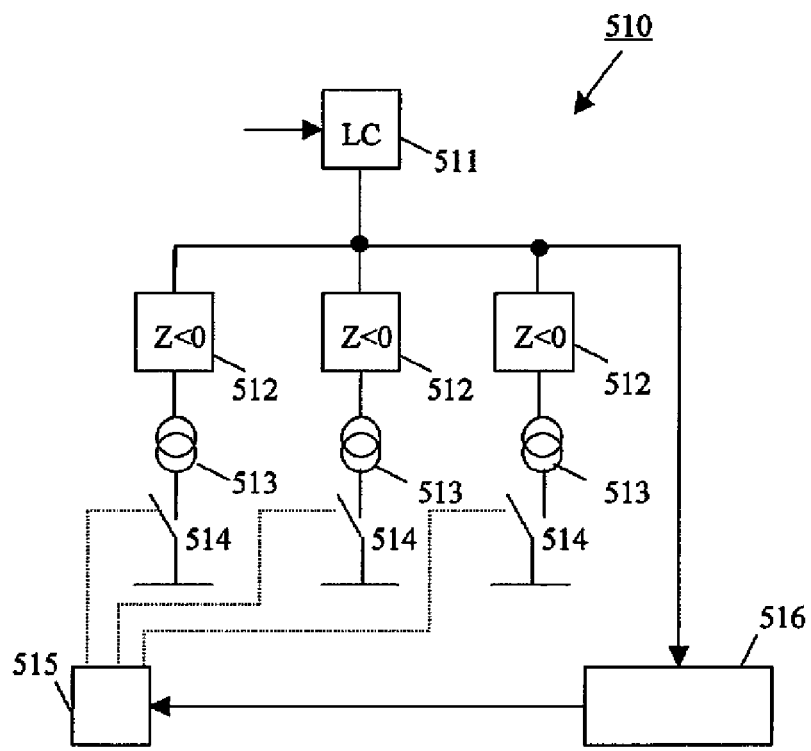
FIG. 15 is a figure showing a conventional oscillator circuit 500.

FIG. 9 is a block diagram showing one configuration example of a communication device according to a fourth embodiment of the present invention. As described in FIG. 9, a communication device 400 according to the fourth embodiment includes: a transmission circuit 410; a reception circuit 420; an antenna duplexer 430; and an antenna 440. The transmission circuit 410 is constructed by using the polar transmission circuit 300 described in the third embodiment. The antenna duplexer 430: transfers, to the antenna 440, a transmission signal outputted from the transmission circuit 410; and prevents the transmission signal from leaking into the reception circuit 420. Furthermore, the antenna duplexer 430: transfers, to the reception circuit 420, a reception signal inputted from the antenna 440; and prevents the reception signal from leaking into the transmission circuit 410.

As a result, the transmission signal is outputted from the transmission circuit 410 and released out into open space from the antenna 440 via the antenna duplexer 430. The reception signal is received by the antenna 440; and then transferred to the reception circuit 420 via the antenna duplexer 430. The communication device 400 according to the fourth embodiment can obtain linearity of the transmission signal 410 and can attain a low-distortion wireless device, by including the polar transmission circuit 300 described in the third embodiment as the transmission circuit 410. Moreover, since the output of the transmission circuit 410 is not branched out to a directional coupler and the like, it is possible to reduce a loss that occurs in between the transmission circuit 410 and the antenna 440, which enables reduction in the electricity consumed at the time of transmission, allowing a prolonged usage as a wireless communication device. The communication device 400 may have a configuration that includes only the transmission circuit 410 and the antenna 440.

The PLL oscillation circuit according to the present invention is useful as an oscillation circuit or the like, which is used as a communication device such as, a mobile phone, a wireless LAN, and the like.

While the invention has been described in detail, the foregoing description is in all aspects illustrative and not restrictive. It is understood that numerous other modifications and variations can be devised without departing from the scope of the invention.

What is claimed is:

1. A PLL oscillation circuit which includes a reference frequency oscillator, a phase comparator, a loop filter, and a voltage-controlled oscillator; the PLL oscillation circuit comprising:
  a PM-PM table that is utilized for compensating a nonlinearity of the voltage-controlled oscillator;
  a variable current source connected in between the voltage-controlled oscillator and a supply potential terminal;
  an amplitude detector that detects an output amplitude of the voltage-controlled oscillator;
  an amplitude controller that controls a current value of the variable current source so as to have the output amplitude of the voltage-controlled oscillator detected by the amplitude detector to be a desired amplitude;
  a LPF connected in between the amplitude controller and the variable current source; and
  a switch that connects or disconnects the LPF between the amplitude controller and the variable current source, and
  when switching an output frequency of the voltage-controlled oscillator, a connection of the switch is turned on, so as to connect the amplitude controller to the variable current source through the switch, and to update a setting value in the PM-PM table to be a value that corresponds to an output frequency after the switching, and
  when the voltage-controlled oscillator outputs a desired frequency signal, the connection of the switch is turned off and the amplitude controller is connected to the variable current source through the LPF.

2. The PLL oscillation circuit according to claim 1, wherein a period, in which the connection of the switch is turned on, is within a non-transmission slot during switching of the output frequency of the voltage-controlled oscillator.

3. The PLL oscillation circuit according to claim 1, wherein the amplitude controller, when switching the output frequency of the voltage-controlled oscillator:
  outputs a predefined initial value;
  outputs, at least once, a changed initial value which is obtained by changing the initial value; and
  controls, when the initial value and the changed initial value are outputted, a current value of the variable current source so as to have the output amplitude of the voltage-controlled oscillator detected by the amplitude detector to be a desired amplitude, based on a fluctuation of the output amplitude of the voltage-controlled oscillator detected by the amplitude detector.

4. The PLL oscillation circuit according to claim 3, wherein:
the amplitude controller calculates, when switching the output frequency of the voltage-controlled oscillator, a coefficient that indicates a relationship between a fluctuation range of the output amplitude of the voltage-controlled oscillator and a fluctuation range of the control signal outputted from the variable current source; and
the amplitude controller controls, when the voltage-controlled oscillator outputs a desired frequency signal, a current value of the variable current source so as to have the output amplitude of the voltage-controlled oscillator detected by the amplitude detector to be a desired amplitude, based on the calculated coefficient.

5. A PLL oscillation circuit according to claim 4, wherein the amplitude controller calculates the coefficient by:
detecting a first output amplitude value of the voltage-controlled oscillator detected by the amplitude detector, when a value obtained by adding the initial value to a predefined value is outputted;
detecting a second output amplitude value of the voltage-controlled oscillator detected by the amplitude detector, when a value obtained by subtracting the predefined value from the initial value is outputted; and
dividing a value, obtained by multiplying the predefined value with two, with another value obtained by subtracting the second output amplitude value from the first output amplitude value.

6. The PLL oscillation circuit according to claim 4, wherein the amplitude controller controls, when the voltage-controlled oscillator outputs a desired frequency signal, a current value of the variable current source so as to have the output amplitude of the voltage-controlled oscillator detected by the amplitude detector to be a desired amplitude, based on the coefficient that indicates the relationship between a fluctuation range of the output amplitude of the voltage-controlled oscillator stored in advance and a fluctuation range of the control signal outputted from the variable current source.

7. The PLL oscillation circuit according to claim 1, wherein the amplitude controller controls a current value of the variable current source so as to have the output amplitude of the voltage-controlled oscillator detected by the amplitude detector to be a desired amplitude, by referencing a LUT configured in advance.

8. The PLL oscillation circuit according to claim 1 further comprises an ADC which conducts a digital conversion of an output signal of the amplitude detector, and which is interposed between the amplitude detector and the amplitude controller.

9. The PLL oscillation circuit according to claim 1 further comprises a DAC which conducts an analog conversion of an output signal of the amplitude controller, and which is interposed between the amplitude controller and the variable current source.

10. A polar transmission circuit comprising:
a coordination converter that converts an input data into an amplitude signal and a phase signal;
a DAC that conducts an analog conversion of the amplitude signal;
a filter that removes a noise from the amplitude signal inputted through the DAC;
a ΔΣ modulator that ΔΣ modulates the phase signal;
the PLL oscillation circuit according the claim 1, which outputs a signal with a frequency according to the phase signal inputted through the ΔΣ modulator; and
a PA that amplifies an output signal of the PLL oscillation circuit according to an output signal of the filter, and outputs the resulting signal as a transmission signal.

11. A communication device comprising:
a transmission circuit that generates a transmission signal; and
an antenna that outputs the transmission signal generated by the transmission circuit, and
the transmission circuit comprises the polar transmission circuit according to claim 10.

12. The communication device according to claim 11 further comprises:
a reception circuit that processes a reception signal received from the antenna; and
an antenna duplexer, which outputs the transmission signal generated by the transmission circuit to the antenna, and which outputs the reception signal received from the antenna to the reception circuit.

* * * * *